United States Patent
Ho et al.

(10) Patent No.: US 7,485,537 B2
(45) Date of Patent: *Feb. 3, 2009

(54) METHOD OF FABRICATING A VERTICAL BIPOLAR TRANSISTOR WITH A MAJORITY CARRIER ACCUMULATION LAYER AS A SUBCOLLECTOR FOR SOI BICMOS WITH REDUCED BURIED OXIDE THICKNESS

(75) Inventors: Herbert L. Ho, New Windsor, NY (US); Mahender Kumar, Fishkill, NY (US); Qiqing Ouyang, Yorktown Heights, NY (US); Paul A. Papworth, Wappingers Falls, NY (US); Christopher D. Sheraw, Wappingers Falls, NY (US); Michael D. Steigerwalt, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 160 days.

This patent is subject to a terminal disclaimer.

(21) Appl. No.: 11/490,326

(22) Filed: Jul. 20, 2006

(65) Prior Publication Data

US 2006/0263993 A1    Nov. 23, 2006

Related U.S. Application Data

(62) Division of application No. 10/931,855, filed on Sep. 1, 2004, now Pat. No. 7,115,965.

(51) Int. Cl.
    *H01L 21/331*      (2006.01)
    *H01L 21/8222*      (2006.01)
    *H01L 21/76*      (2006.01)

(52) U.S. Cl. .................. 438/309; 438/311; 438/312; 438/313; 438/342

(58) Field of Classification Search .............. 438/309, 438/311, 313, 322, 340, 342, 312; 257/E21.372, 257/E21.38–21.381, E21.608–21.613, E21.369–21.393
See application file for complete search history.

(56) References Cited

U.S. PATENT DOCUMENTS

| | | | | |
|---|---|---|---|---|
| 5,352,624 A | * | 10/1994 | Miwa et al. | 438/155 |
| 5,548,156 A | * | 8/1996 | Miwa et al. | 257/517 |
| 5,580,797 A | * | 12/1996 | Miwa et al. | 438/311 |
| 5,627,401 A | | 5/1997 | Yallup | |

(Continued)

OTHER PUBLICATIONS

Cai, Jin et al., "Vertical SiGe-Base Bipolar Transistors on CMOS-Compatible SOI Substrate," 2003 IEEE Bipolar/BiCMOS Circuits and Tech. Meeting.

(Continued)

*Primary Examiner*—Jacob Y. Choi
*Assistant Examiner*—Nga Doan
(74) *Attorney, Agent, or Firm*—Scully, Scott, Murphy & Presser, P.C.; Ido Tuchman, Esq.

(57) ABSTRACT

The present invention provides a a method of fabricating bipolar junction transistors (BJTs) on selected areas of a very thin buried oxide (BOX) using a conventional silicon-on-insulator (SOI) starting wafer with a thick BOX. The reduced BOX thickness underneath the bipolar devices allows for a significantly reduced substrate bias compatible with the CMOS to be applied while maintaining the advantages of a thick BOX underneath the CMOS.

1 Claim, 9 Drawing Sheets

U.S. PATENT DOCUMENTS

| | | | |
|---|---|---|---|
| 6,538,916 B2 * | 3/2003 | Ohsawa | 365/149 |
| 7,115,965 B2 * | 10/2006 | Ho et al. | 257/526 |
| 2004/0099881 A1 * | 5/2004 | Franosch et al. | 257/197 |
| 2004/0115878 A1 * | 6/2004 | Lee et al. | 438/202 |
| 2005/0001236 A1 * | 1/2005 | Haeusler et al. | 257/197 |
| 2005/0184360 A1 * | 8/2005 | Ho et al. | 257/565 |
| 2006/0019458 A1 * | 1/2006 | Chidambarrao et al. | 438/309 |
| 2006/0043530 A1 * | 3/2006 | Ho et al. | 257/565 |

OTHER PUBLICATIONS

Jin Cai et al., "Vertical SiGe-Base Bipolar Transistors on CMOS-Compatible SOI Substrate." May 22, 2008.

* cited by examiner

METHOD OF FABRICATING A VERTICAL BIPOLAR TRANSISTOR WITH A MAJORITY CARRIER ACCUMULATION LAYER AS A SUBCOLLECTOR FOR SOI BICMOS WITH REDUCED BURIED OXIDE THICKNESS

RELATED APPLICATIONS

This application is a divisional of U.S. application Ser. No. 10/931,855, filed Sep. 1, 2004, now U.S. Pat. No. 7,115,965.

FIELD OF THE INVENTION

The present invention relates to a semiconductor device, and more particularly a vertical bipolar transistor that is formed using silicon-on-insulator (SOI) integrated bipolar transistor and complementary metal oxide semiconductor (hereinafter BiCMOS) technology.

BACKGROUND OF THE INVENTION

The semiconductor industry has been seeking more cost effective solutions for manufacturing BiCMOS devices for mass applications of radio frequency (RF)/analog and wireless/fiber-based telecommunications for decades. Si/SiGe BiCMOS technology is widely used and has been quite successful. However, as complementary metal oxide semiconductor (CMOS) adopts thin silicon-on-insulator (SOI) substrates for lower power and higher speed (due to device scaling), the thick subcollector of conventional bipolar junction transistors (BJTs) becomes incompatible with the integration of high-performance SOI CMOS devices.

In order to facilitate integration with SOI CMOS, lateral SOI BJTs have been proposed and studied. See, for example, S. Parke, et al. "A versatile, SOI CMOS technology with complementary lateral BJT's", IEDM, 1992, Technical Digest, 13-16 Dec. 1992, page(s) 453-456; V. M. C. Chen, "A low thermal budget, fully self-aligned lateral BJT on thin film SOI substrate for lower power BiCMOS applications", VLSI Technology, 1995. Digest of Technical Papers. 1995 Symposium on VLSI Technology, 6-8 Jun. 1995, page(s) 133-134; T. Shino, et al. "A 31 GHz finax lateral BJT on SOI using self-aligned external base formation technology", Electron Devices Meeting, 1998. IEDM '98 Technical Digest, International, 6-9 Dec. 1998, page(s) 953-956; T. Yamada, et al. "A novel high-performance lateral BJT on SOI with metal-backed single-silicon external base for low-power/low-cost RF applications", Bipolar/BiCMOS Circuits and Technology Meeting, 1999. Proceedings of the 1999, 1999, page(s) 129-132; and T. Shino, et al. "Analysis on High-Frequency Characteristics of SOI Lateral BJTs with Self-Aligned External Base for 2-GHz RF Applications", IEEE, TED, vol. 49, No. 3, pp. 414, 2002.

Even though lateral SOI BJT devices are easier to integrate with SOI CMOS, the performance of such devices is quite limited. This is because the base width in the lateral SOI BJTs is determined by lithography. Hence, it cannot be scaled down (less than 30 nm) readily without more advanced and more expensive lithography technologies such as e-beam lithography.

Another type of SOI BJT, which is a vertical SOI SiGe bipolar device, has also been proposed and demonstrated to offer higher base-collector breakdown voltage, higher early voltage and better BVCEO-fT tradeoff. This type of SOI BJT is described, for example, in J. Cai, et al., "Vertical SiGe-Base Bipolar Transistors on CMOS-Compatible SOI Substrate", 2003 IEEE Bipolar/BiCMOS Circuits and Technology Meeting. This SOI BJT device uses a fully depleted SOI layer as the collector at zero substrate bias. The application of a substrate bias to this SOI BJT device allows for significant improvement in overall device performance by reducing collector space-charge region transit time and collector resistance through the formation of an accumulation layer.

A problem with the SOI BJT device described above is that the buried oxide (BOX) layer in high performance CMOS SOI substrates is typically 100-200 nm thick. As a result, the substrate bias needed for significant performance improvement is unacceptably large (greater than about 20 V). In order for these devices to be practical for SOI BiCMOS applications, the substrate bias must be held at or below the voltage applied to the CMOS, typically less than 3 V.

In view of the above, there is a need for providing a SOI BJT structure that overcomes the drawbacks mentioned in the prior art SOI BJTs.

SUMMARY OF THE INVENTION

The present invention provides a vertical SOI BJT which uses a SOI layer with a back gate-induced majority carrier accumulation layer as a subcollector located on regions of a second buried insulating region having a second thickness using a standard SOI starting wafer with a first buried insulating region having a first thickness and the method thereof. In accordance with the present invention, the first thickness of the first buried insulating region is greater than the second thickness of the second buried insulating region. The reduced thickness of the second buried insulating region underneath the bipolar devices allows for a significantly reduced substrate bias that is CMOS compatible, while maintaining the advantages of the thick first buried insulating region underneath the CMOS.

The accumulation layer can then be formed to reduce collector resistance and transit time by applying a back-bias that will not compromise the quality and reliability of the CMOS.

A method of forming a bipolar transistor including a localized thin buried insulating region (second buried insulating region) is provided. In broad terms, the method of the present invention includes the steps of:

providing a silicon-on-insulator (SOI) substrate comprising a first semiconductor layer containing a first conductivity type dopant located over a first buried insulating layer, wherein a portion of the first buried insulating layer beneath said first semiconductor layer is removed providing an undercut region;

forming a second buried insulating layer on exposed surfaces of said first semiconductor layer, wherein said second buried insulating layer is thinner than said first buried insulating layer;

filling the undercut region and the removed portion of the first semiconductor layer with a conductive back electrode material;

forming a base comprising a second semiconductor layer containing a second conductivity type dopant that is different than the first conductivity type dopant on said substrate;

forming an emitter comprising a third semiconductor layer including said first conductivity type dopant over a portion of said base; and biasing the conductive back electrode material to form an accumulation layer at an interface between the first semiconductor layer and the second buried insulating layer.

The first semiconductor layer includes an intrinsic collector and an extrinsic collector. The base may include a single crystal portion atop semiconductor material, and a polycrystalline portion atop insulating material.

In accordance with the present invention, a vertical NPN or PNP SOI BJT can be formed. The NPN transistor is formed when the first and third semiconductor layers contain an n-type dopant, while the second semiconductor layer comprises a p-type dopant. A PNP transistor is formed when the first and third semiconductor layers contain a p-type dopant and the second semiconductor layer contains an n-type dopant.

Specifically, a trench is first etched through the first semiconductor layer of an SOI substrate exposing the first buried insulating layer which normally has a thickness from about 100 to about 500 nm. A portion of the first buried insulating layer is then removed using an isotropic etch process that undercuts the first semiconductor layer. A thin insulating layer (less than about 15 nm) is then grown to form the second buried insulating layer. The trench and area where the first buried insulating layer was removed is filled in with a conductive material such as in-situ doped polysilicon. The conductive-fill can then be used to apply a substrate bias. These processing steps provide a structure that includes a conductive back electrode that contains a second buried insulating region of a second thickness located on a surface thereof and a first buried insulating region of a first thickness that is greater than the second thickness that is located abutting the region containing the conductive back electrode and the overlayer first insulating layer. In accordance with the present invention, a bipolar device can be formed atop this structure such that it is located above the second buried insulating layer.

With such a reduced buried insulating layer thickness underneath the bipolar device, a significantly reduced substrate bias (less than 3 V) compatible with the CMOS is able to create a strong enough vertical electric field to form an accumulation layer which forms the subcollector of the inventive device, while maintaining the advantages of a thick first buried insulating layer underneath the CMOS.

There are no known alternative solutions to this problem. One possible alternative is to use a patterning process to form regions of thin and thick buried insulating regions on the SOI wafer during a SIMOX (separation by implantation of oxygen) process. However, by using an oxygen implant, it is difficult to make a buried insulating region having a thickness of less than 10 nm. Moreover, it is difficult to control the thickness of the buried insulating region formed by conventional SIMOX processes. Also, this method purposed above would require costly additional lithography and implant steps to produce the SOI wafers.

In addition to the method described above, the present invention also contemplates the bipolar transistor that is formed utilizing the above method. Specifically, and in broad terms, the bipolar transistor of the present invention comprises:

a conductive back electrode for receiving a bias voltage;

a second buried insulating layer located over said conductive back electrode having a second thickness;

a first buried insulating layer located adjacent to said second buried insulating layer and said conductive back electrode, said first buried insulating layer having a first thickness that is greater than the second thickness;

a first semiconductor layer located predominately over said second buried insulating layer, said first semiconductor layer including a first conductivity type dopant, wherein said conductive back electrode is biased to form an accumulation layer in said first semiconductor layer at an interface between said first semiconductor layer and said second buried insulating layer;

a base located atop at least said first semiconductor layer, said base comprising a second semiconductor layer having a second conductivity type dopant that differs from the first conductivity type dopant; and an emitter comprising a third semiconductor layer of the first conductivity type dopant located over a portion of said base.

In addition to SOI BJT's the present invention, in particularly the substrate including different regions of buried insulating thickness could be used as a substrate for forming a back-gated complementary metal oxide semiconductor (CMOS) device. The back-gated CMOS device could be formed alone on the substrate or it could be formed with a bipolar transistor, including the SOI HBT described above, in BiCMOS applications.

DETAILED DESCRIPTION OF THE INVENTION

Figure 1A:
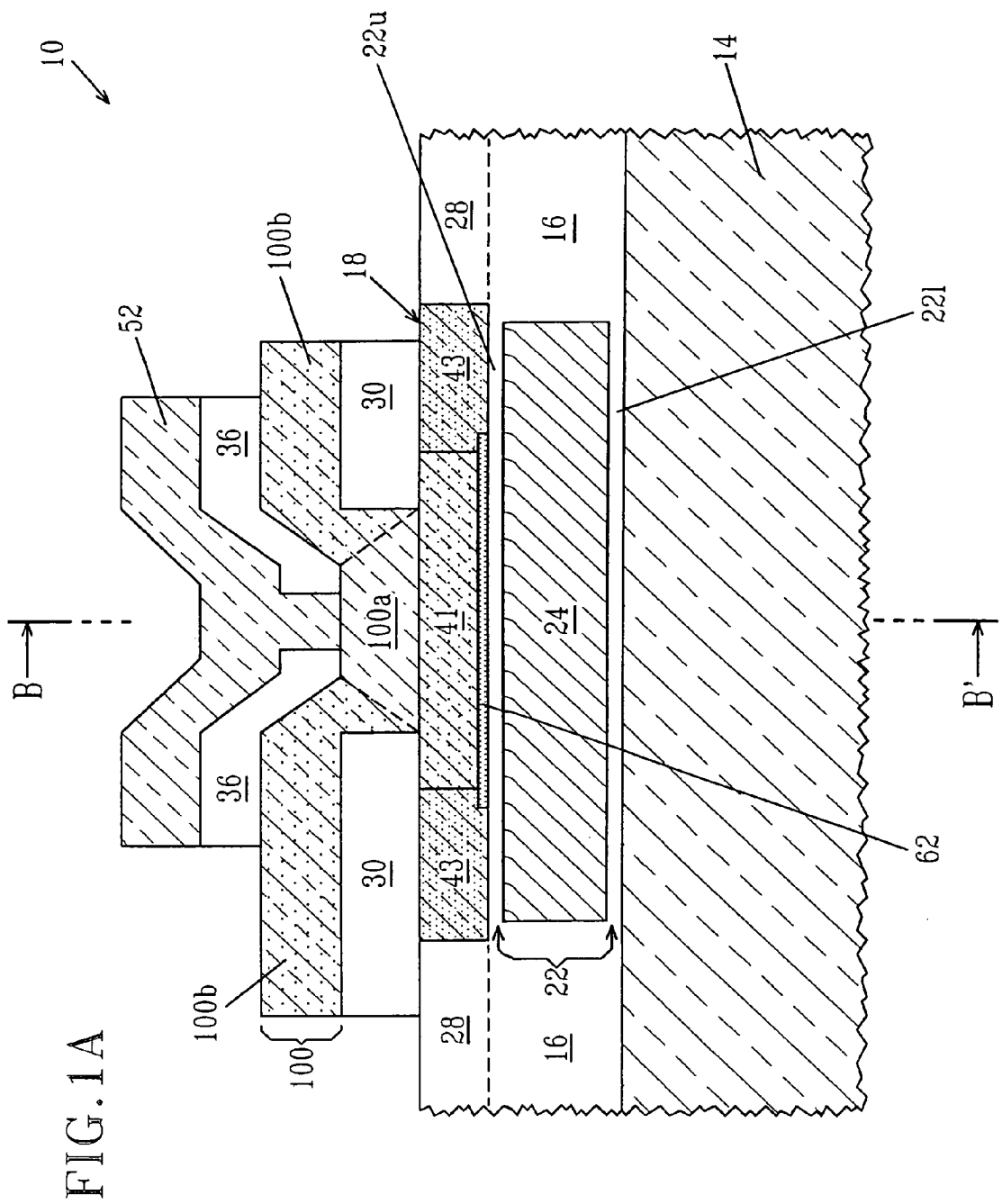
FIGS. 1A-1B are pictorial representations (through different views) illustrating a single-finger emitter device of the present invention along two directions that are perpendicular to each other.

The present invention, which provides a vertical SOI BJT which uses a SOI layer with a back gate-induced accumulation layer as the subcollector located on regions of a second buried insulating region having a second thickness using a standard SOI starting wafer with a first buried insulating region having a first thickness and the method thereof, will now be described in greater detail by referring to the drawings that accompany the present application. The drawings are provided for illustrative purposes and thus they are not drawn to scale. Moreover, in the drawings like and/or corresponding elements are referred to by like reference numerals.

The present invention provides a bipolar transistor structure that includes a conductive back electrode for receiving a bias voltage, a second buried insulating layer located over the conductive back electrode, and a first semiconductor layer, which comprises an SOI layer of a SOI substrate, located over the second buried insulating layer. The first semiconductor layer includes a collector region containing a first conductive type dopant. The collector region includes an intrinsic collector and an extrinsic collector. The extrinsic collector and the intrinsic collector, which are of the first conductivity type, have different dopant concentration; the extrinsic collector having a higher dopant concentration that the intrinsic collector.

In accordance with the present invention, a base comprising a second semiconductor layer containing a second conductivity type dopant is located atop the first semiconductor layer. The inventive bipolar transistor also includes an emitter comprising a third semiconductor layer containing the first conductivity type dopant located over a portion of the base, e.g., the second semiconductor layer. During operation, the conductive back electrode is biased to form an accumulation layer in the SOI layer at an interface between the SOI layer and the second buried insulating layer. The configuration of the inventive bipolar transistor structure will become more apparent by referring to FIGS. 1A-1B.

Figure 1B:
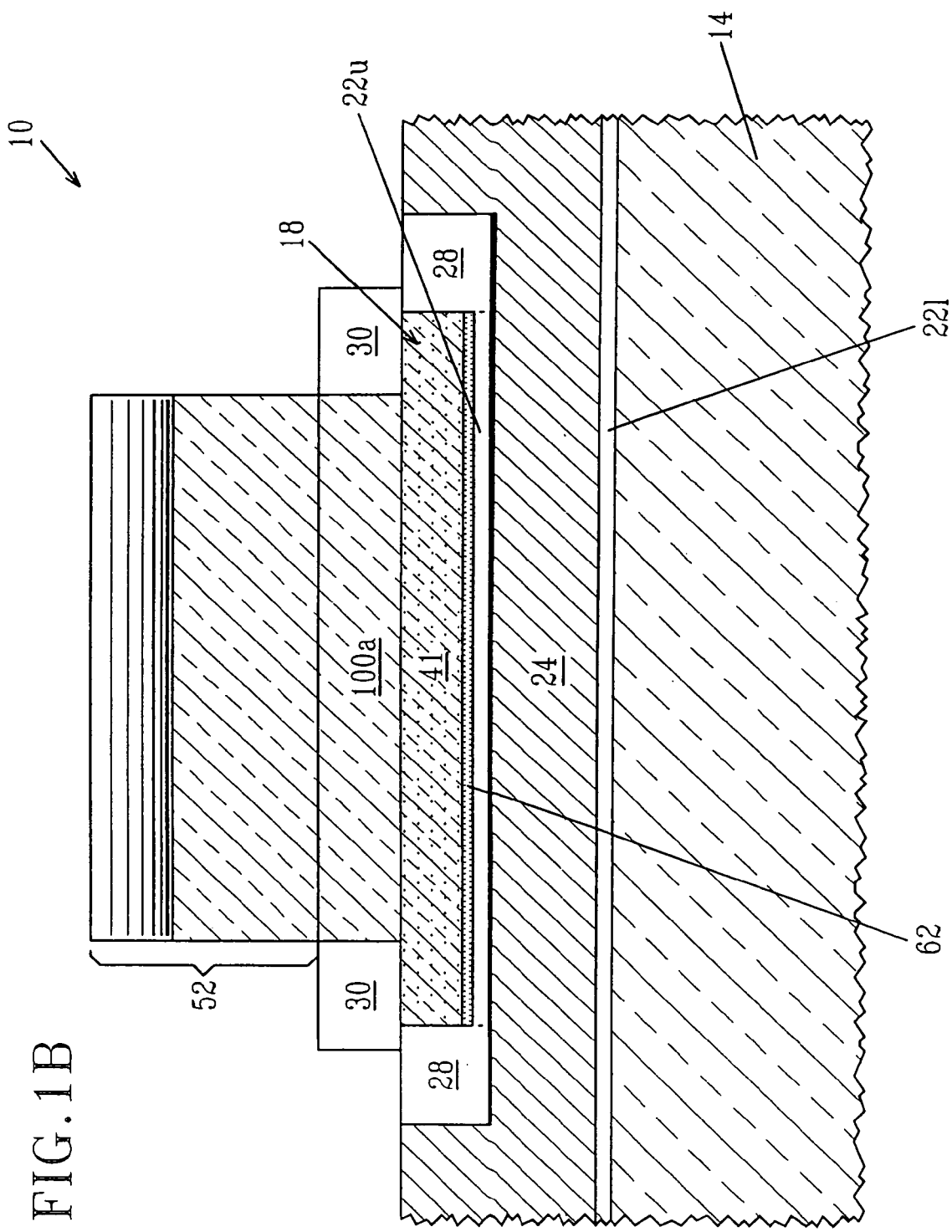

One possible device layout of the inventive bipolar transistor is shown in FIGS. 1A-1B wherein a single-finger emitter device is shown. By "finger", it is meant that the emitter has at least one portion that extends outward from a common emitter region. Although the drawings show a one-finger emitter device, the present invention is not limited to only that device layout. Instead, the present invention contemplates device layouts that include a number of emitter-fingers. Multi-finger configurations are preferred over the singe-finger device layout since they typically reduce the emitter resistance for achieving high $f_{max}$, i.e., the maximum oscillation frequency at which the unilateral power gain becomes unity.

The cross sectional views of the single-finger emitter device layout is shown in FIGS. 1A and 1B. FIG. 1A is the cross sectional view along an axis B-B', while FIG. 1C is the cross sectional view along an axis C-C'; the two axis are perpendicular to each other. Specifically, the cross sectional views shown in FIG. 1A and FIG. 1B depict a vertical bipolar transistor 10 of the present invention. The vertical bipolar transistor 10 includes a Si-containing substrate layer 14, a first buried insulating layer 16 having a first thickness, a second buried insulating layer 22 having a second thickness that is less than the first thickness of the first buried insulating layer 16. As shown, the first buried insulating layer 16 is located on an upper surface of the Si-containing substrate 14 and the second buried insulating layer 22 is located around the conductive back electrode 24. The second buried insulating layer 22 thus includes an upper portion 22u located atop the conductive back electrode 24 and a lower portion 22l located atop the Si-containing substrate 14. The upper portion 22u of the second buried insulating layer 22 is the region in which the accumulation layer will form thereon.

The vertical bipolar transistor 10 shown in FIGS. 1A-1B further includes trench isolation regions 28 that are located, as shown in FIG. 1A, atop the first buried insulating layer 16, as well as atop the conductive back electrode 24, as shown in FIG. 1B. Hence, the trench isolation regions 28 surround the active device region of the structure. The structure also includes a first semiconductor layer 18 (hereinafter referred to as the SOI layer) which is located on the upper portion 22u of the second buried insulating layer 22 as well as a portion of the first buried insulating layer 16. The first semiconductor layer 18 is the original SOI layer of the initial substrate employed in the present invention.

In accordance with the present invention, the first semiconductor layer 18 is the collector region of the inventive structure that is doped with a first conductivity type dopant, either an n- or p-type dopant. The collector region includes an intrinsic collector 41 and an extrinsic collector 43 that has a greater dopant density, i.e., concentration, as compared to intrinsic collector 41. As shown, the intrinsic collector 41 is located between two extrinsic collectors 43.

A base (or base region) 100 is located atop the SOI layer 18 and the trench isolation region 28. The base 100 comprises a second semiconductor layer of a second conductivity type dopant that differs in terms of its conductivity from the first conductivity type dopant. The base 100 comprises a polycrystalline portion 100b and a single crystalline portion 100a. As shown, the polycrystalline portion 100b is located predominately atop isolation regions, while the single crystal portion 100a is located atop the SOI layer 18.

Atop of the base 100 is an emitter 52 which is comprised of a third semiconductor layer. The third semiconductor layer forming emitter 52 may be comprised of the same or different material as the base 100 or the SOI layer 18. The emitter 52 is heavily doped with the first conductivity type dopant. First insulator 30 and second insulator 36 are located in the structure as well. The first insulator 30 is located atop the structure including the SOI layer 18 and it has an opening therein in which the intrinsic portion 100a of the base 100 is in contact with the SOI layer 18. The second insulator 36 is located atop portions of the base 100 and it also has an opening therein that allows the emitter 52 to be in contact with the intrinsic portion 100a of the base 100.

Although not shown, the exposed portions of the emitter 52, the SOI layer 18, the polycrystalline region 100b and conductive back electrode 24 may include a metal silicide. The metal silicide located atop the exposed surfaces of the conductive back electrode 24 is the region in which biasing of the substrate can take place. During biasing, a portion of the SOI layer 18 that is located atop the upper portion 22u of the second buried insulating region 22 is converted into an accumulation layer 62. The accumulation layer 62 is a majority carrier layer that serves as the subcollector of the inventive bipolar transistor. This is unlike prior art bipolar transistor in which the subcollector is comprised of an impurity-doped region.

The process flow for making a substrate that includes the buried insulating regions of different thicknesses is illustrated in FIGS. 2A-2E. It is noted that the process shown and described in making the substrate shown is similar to the process disclosed in co-pending and co-assigned U.S. patent application Ser. No. 10/787,002, filed Feb. 25, 2004, the entire content of which is incorporated herein by reference. In the following description of the first and second buried insulating layers (or regions) 16 and 22, respectively, are referred to as buried oxide (BOX) regions. Although BOX regions are depicted and described as oxides, the present invention works equally well when the regions 16 and 22 are other insulating materials, i.e., nitrides or oxynitrides.

Figure 2A:
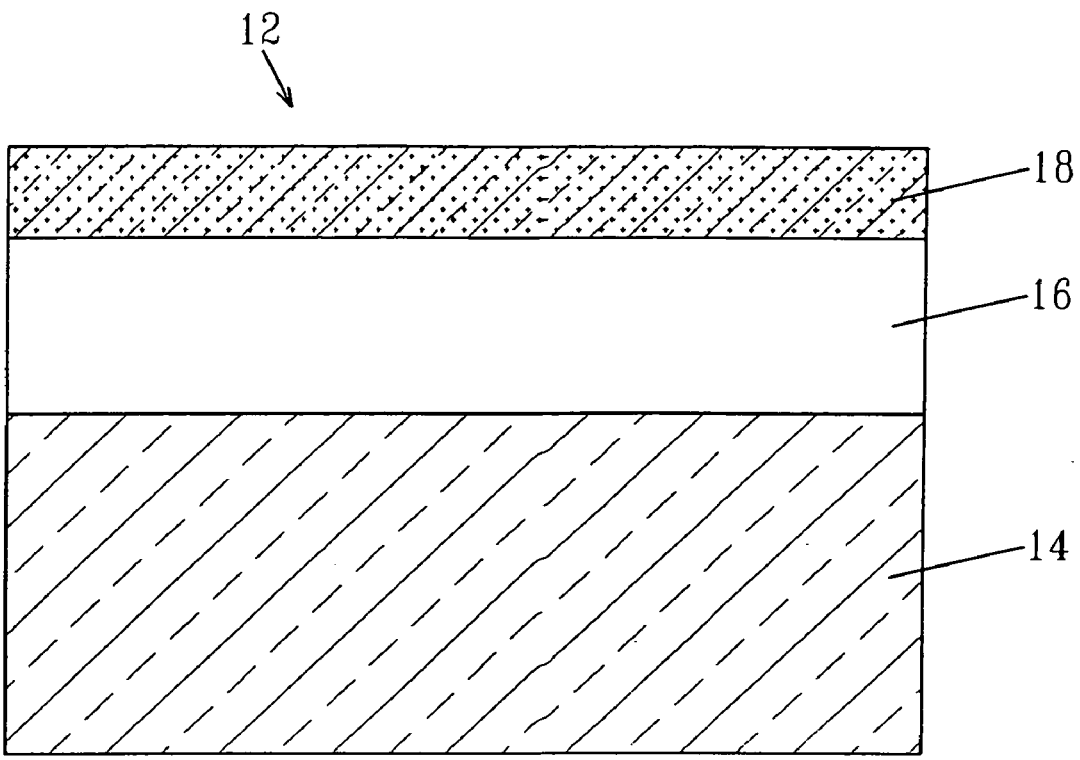
FIGS. 2A-2E illustrate the process flow for making the substrate that is employed in the present invention which includes a second buried insulating region that is thin and an adjoining first buried insulating region that has a thickness that is greater than the second buried insulating region. The second buried insulating region is located atop a conductive back electrode.

FIG. 2A shows the cross-section of a typical SOI substrate 12 used for a high-performance CMOS application that can be employed in the present invention. The initial SOI substrate 12 comprises a Si-containing substrate layer 14, a first buried insulating layer 16 of a first thickness (herein after thick BOX) 16, and a top Si-containing layer 18 (which is, in accordance with the nomenclature of the present invention, the first semiconductor layer or the SOI layer 18). The term "Si-containing" is used herein to denote any semiconductor material that includes silicon therein.

Illustrative examples of such Si-containing materials include but are not limited to: Si, SiGe, SiGeC, SiC, Si/Si, Si/SiGe, preformed SOI wafers, silicon germanium-on-insulators (SGOI) and other like semiconductor materials.

The SOI layer 18 of the initial SOI substrate 12 is typically a doped layer, which may contain an n- or p-type dopant. Doping can be introduced into the SOI layer 18 prior to, or after formation of the SOI substrate 12. The doped SOI layer 18 comprises the collector region of the inventive bipolar transistor 10. The dopant concentration within the SOI layer 18 is typically from about 1E17 to about 1E19 atoms/cm$^3$.

The Si-containing layer 18 of the SOI substrate 12 may have a variable thickness, which is dependent on the technique that is used in forming the SOI substrate 12. Typically, however, the Si-containing layer 18 of the SOI substrate 12 has a thickness from about 10 to about 1000 nm, with a thickness from about 50 to about 500 nm being more typical. The thickness of the thick BOX 16 may also vary depending upon the technique used in fabricating the SOI substrate 12. Typically, however, the thick BOX 16 of the present invention has a thickness from about 100 to about 1000 nm, with a BOX thickness from about 120 to about 200 nm being more typical. The thickness of the Si-containing substrate layer 14 of the SOI substrate 12 is inconsequential to the present invention.

The initial SOI substrate 12 can be formed using a layer transfer process such as, a bonding process. Alternatively, a technique referred to as separation by implanted oxygen (SIMOX) wherein ions, typically oxygen, are implanted into a bulk Si-containing substrate and then the substrate containing the implanted ions is annealed under conditions that are capable of forming a buried insulating layer, i.e., thick BOX 16, can be employed.

Figure 2B:
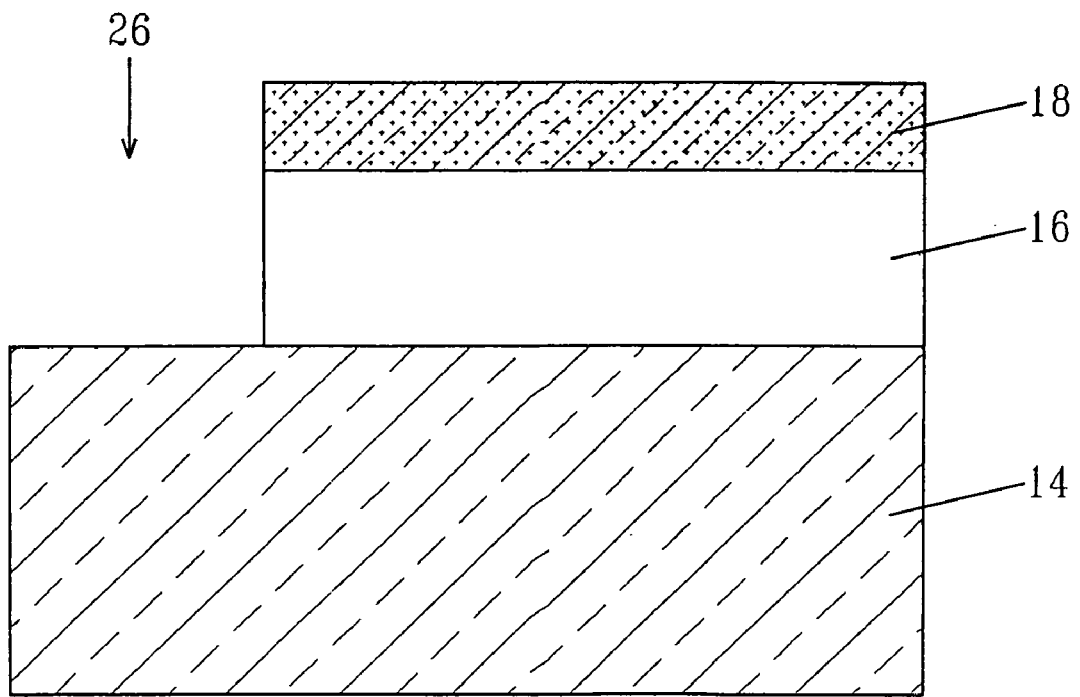

Next, and as shown in FIG. 2B, at least one trench 26 that extends to the upper surface of the Si-containing substrate layer 14 is formed by lithography and etching. The lithography step includes applying a photoresist to the surface of the SOI substrate 12, exposing the photoresist and developing the exposed photoresist using a conventional resist developer. The etching step used in forming the trench 26 includes any standard Si directional reactive ion etch process. Other dry etching processes such as plasma etching, ion beam etching and laser ablation, are also contemplated herein. The etch can be stopped on the top of the thick BOX 16 (not shown), or on the Si-containing substrate 14 underneath the thick BOX 16, as shown in FIG. 2B. As shown, portions of the SOI layer 18 and the thick BOX 16 that are protected by the patterned photoresist are not removed during etching. After etching, the patterned photoresist is removed utilizing a conventional resist stripping process.

Figure 2C:
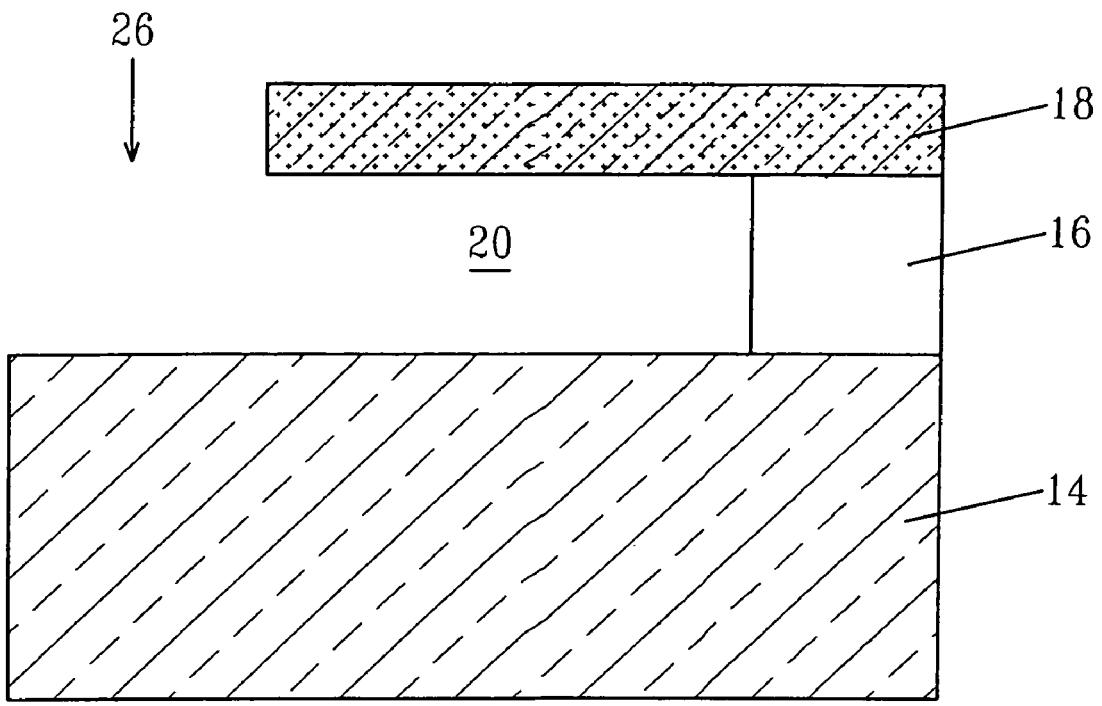

An isotropic oxide etch selective to silicon (such as a timed hydrofluoric acid based etch or similar etch chemistry) is then used to remove portions of the thick BOX 16 underneath the SOI layer 18 where the vertical bipolar device will be fabricated (See FIG. 2C). The isotropic etch forms an undercut 20 beneath the SOI layer 18 that will be subsequently filled with a conductive back electrode material. The SOI layer 18 is supported by portions of the thick BOX 16 that are not removed by this etch. Before this etching step, all pad layers should be removed from atop the SOI layer otherwise bending of the SOI layer occurs.

Figure 2D:
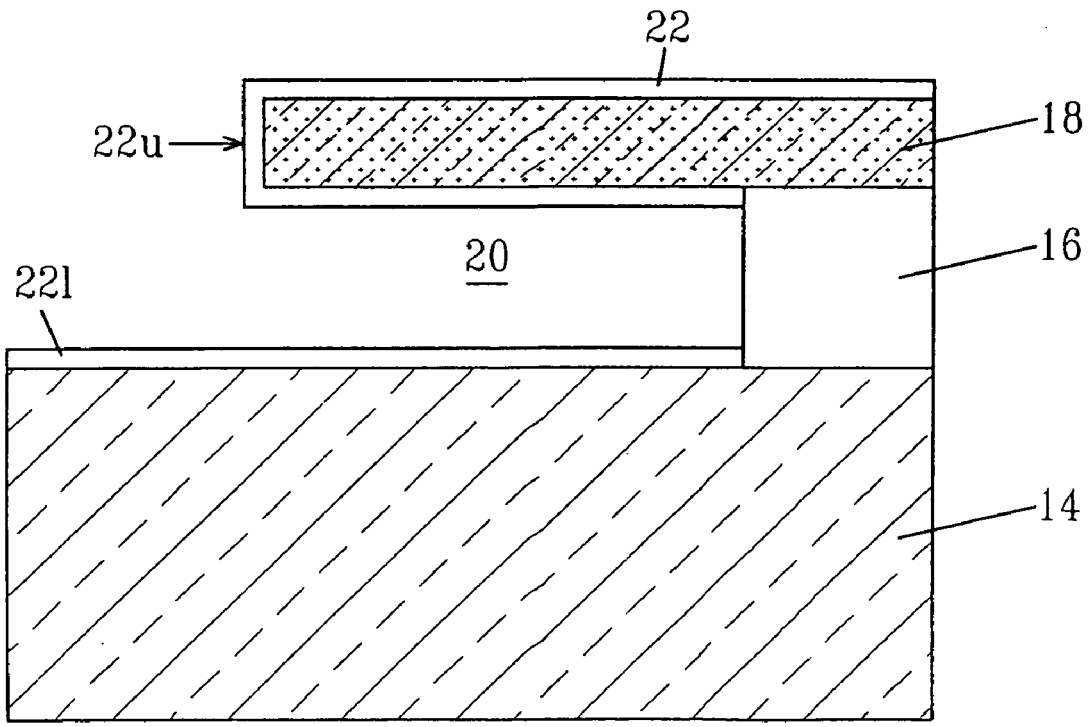

A thermal process such as a wet and/or dry oxidation, nitridation or oxynitridation, is then used to grow the second buried insulating layer 22, i.e., thin BOX, on the exposed surfaces of the SOI layer 18, see FIG. 2D. Note that the second buried insulating layer (hereinafter thin BOX) 22 forms on the exposed horizontal and vertical surfaces of the SOI layer 18 as well as the exposed surface of the Si-containing substrate layer 14. The thin BOX 22 formed on the SOI layer 18 is given the reference numeral 22u, while the BOX formed on the Si-containing substrate layer 12 is given the reference numeral 22l. In accordance with the present invention, the thin BOX 22 has a second thickness that is less than the first thickness of the first buried insulating layer, i.e., thick BOX 16. Typically, the thin BOX 22 has a thickness from about 1 to about 15 nm. Deposited oxides such as a low-temperature oxide (LTO) or a high-density oxide (HTO) can also be employed. When deposited oxides are used, the oxide would also be present on the sidewalls of the opened structure as well. Note that the oxide also grows, although to a lesser extent, on oxide surfaces as well. The growth of oxide on an oxide surface is not, however, differentiated in the drawings of the present application.

At this point of the present invention, a conductive back gate electrode material (which becomes the conductive back electrode 24) such as, for example, doped polysilicon, a silicide or a conductive metal is deposited to fill in the area previously occupied by the removed thick BOX 16. The deposition is performed using a conventional deposition process such a chemical vapor deposition, plasma-assisted chemical vapor deposition, chemical solution deposition, evaporation and the like. In one embodiment, doped polysilicon is used as the conductive back electrode material and it is deposited at a temperature from about 400° to about 700° C. using a low-pressure chemical vapor deposition (LPCVD) process. Doping of the polysilicon layer may occur in-situ or after deposition using an ion implantation process. The structure can then be planarized, if needed, by chemical mechanical polishing or by a dry etch of the polysilicon selective to oxide. The resultant structure that is formed after performing the above steps is shown, for example, in FIG. 2E.

Figure 3A:
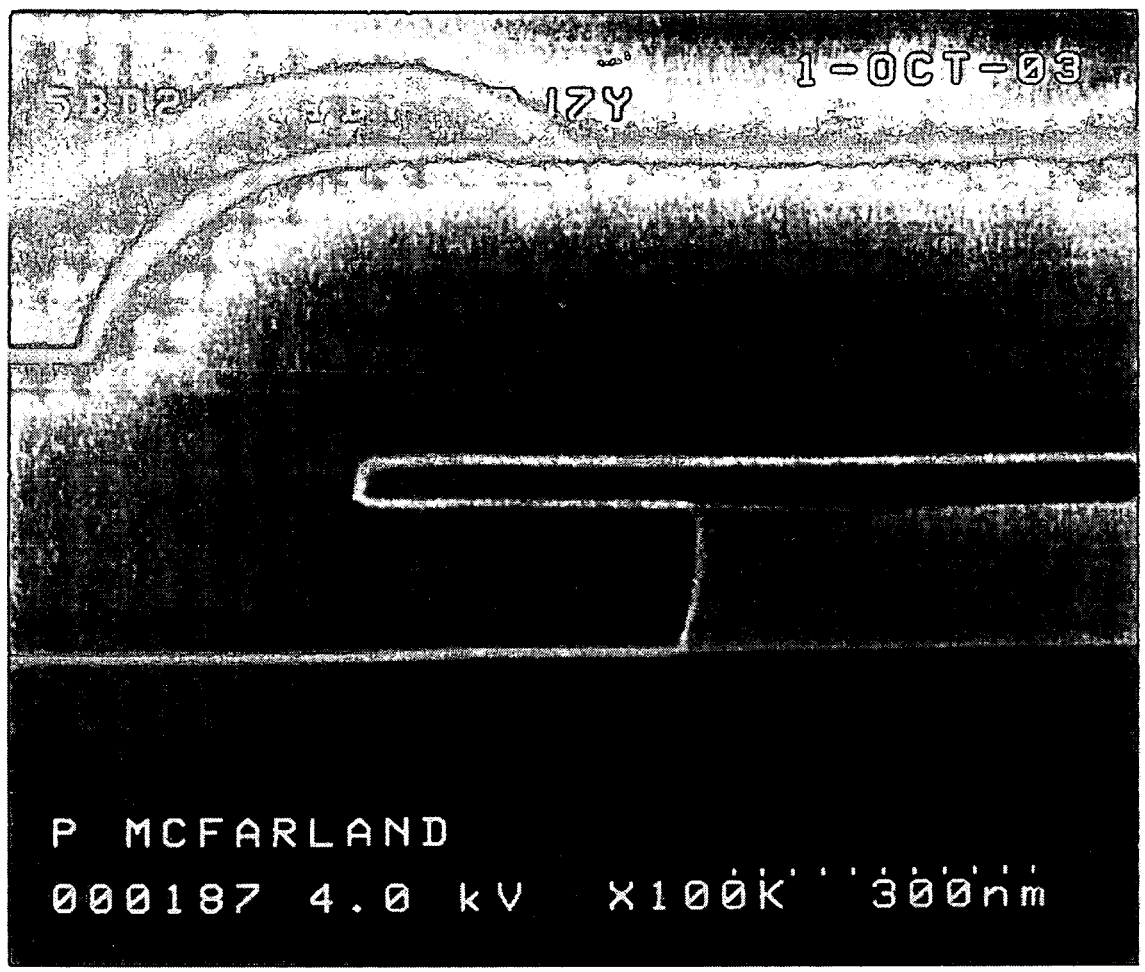
FIGS. 3A-3B show cross sections of an SOI wafer that underwent the process illustrated in FIGS. 2A-2E. In the drawings, the first buried insulating layer was undercut by 0.3 microns. An 8 nm thick thermal oxide, e.g., the second buried insulating layer, was then grown followed by LPCVD polysilicon fill to form the conductive back electrode.
Figure 3B:
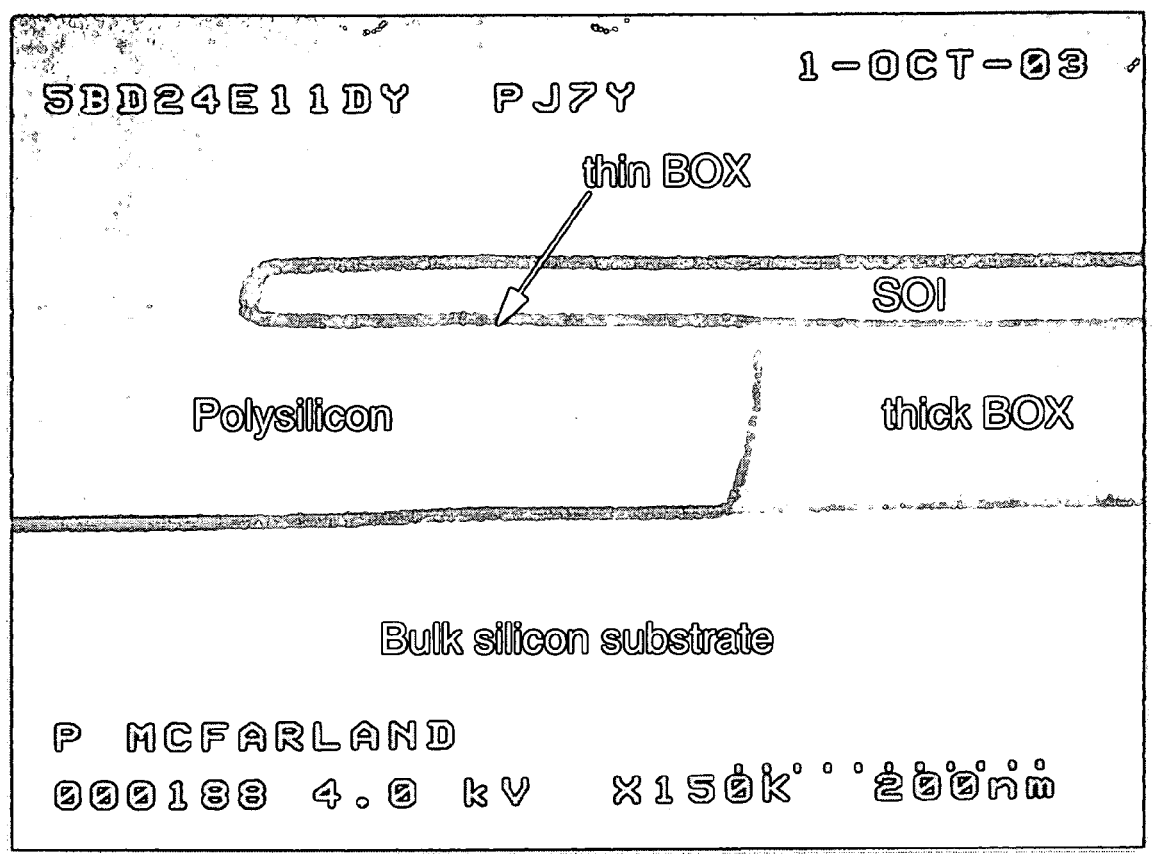

FIG. 3A and FIG. 3B show an SEM cross section of an SOI wafer that underwent the process described above. The BOX was undercut by 0.3 microns. An 8 nm thick thermal oxide was then grown followed by LPCVD polysilicon fill.

Figure 2E:
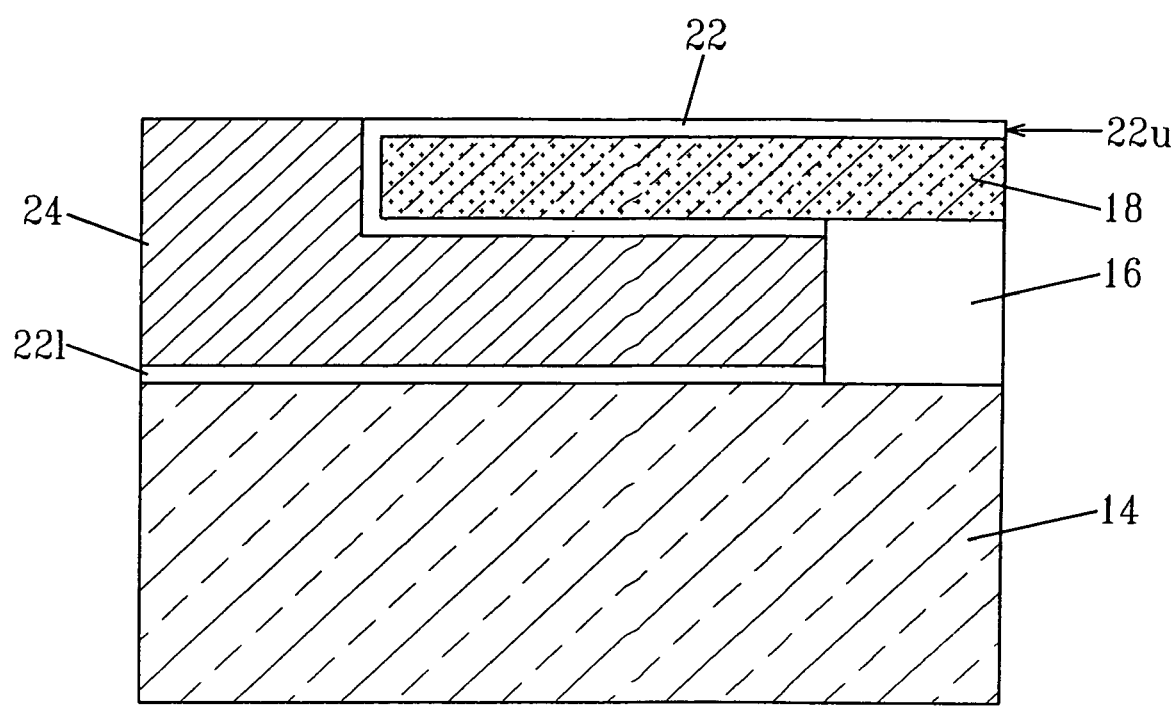
Figure 4:
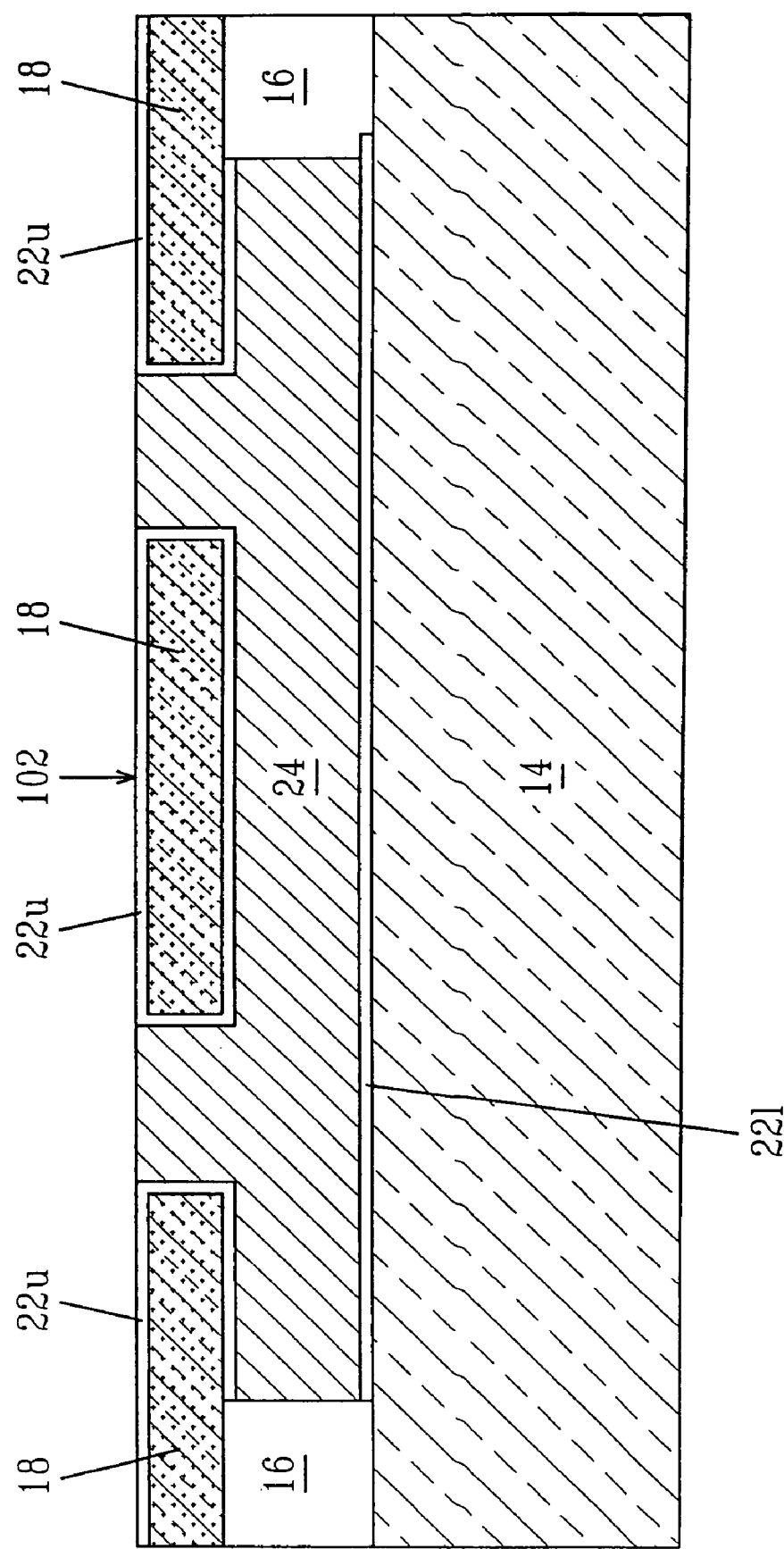
FIG. 4 is a cross sectional view illustrating an expanded view of the structure shown in FIG. 2E.

FIG. 4 shows an expanded cross sectional view of the structure depicted in FIG. 2E. Region 102 denotes the active device area in which a bipolar transistor can be formed. The active area 102 includes an upper thin BOX 22u located atop the conductive back electrode 24. The conductive electrode 24, in turn, is located on the lower thin BOX 22l, which is located atop the Si-containing substrate layer 14.

After providing the structure shown in FIG. 2E (or FIG. 4), a bipolar device such as shown in FIG. 1B is formed atop the structure utilizing conventional BiCMOS processing techniques that are well known to those skilled in the art. Specifically, the following process can be used in forming the bipolar transistor atop the structure shown in FIG. 2E (or FIG. 4).

First, trench isolation regions 28 are formed into the structure shown in FIG. 2E (or FIG. 4) utilizing conventional processes well known to those skilled in the art. For example, the trench isolation regions 28 can be formed by trench definition and etching, optionally lining the trench with a liner material and then filling the trench with a trench dielectric material such as, for example, tetraethylorthosilicate (TEOS) or a high-density oxide. The trench dielectric material can be densified after the filling of the trench and, if needed, a planarization process, such as chemical mechanical polishing, can be employed.

Next, the SOI layer 18 can be further doped at this point of the present invention with a first conductivity type dopant (n- or p-type) using various masked implantation schemes to provide an extrinsic collector and/or intrinsic collector within the SOI layer 18. A first insulator 30, such as an oxide, nitride, oxynitride or multilayers thereof, is then formed on the surface of the structure by a thermal process or by deposition, such as chemical vapor deposition. The thickness of the first insulator 30 can vary depending on the technique used in forming the same. Typically, the first insulator 30 has a thickness from about 10 to about 100 nm.

After forming the first insulator 30 on the surface of the structure shown in FIG. 2E (or FIG. 4), the first insulator 30 is patterned to provide an opening that exposes a surface of the SOI layer 18. The at least one opening in the first insulator 30 is formed by lithography and etching.

Next, the base 100 is formed by utilizing a low-temperature epitaxial growth process that is typically performed at a temperature from about 450° C. to about 800° C. In accordance with the present invention, the base 100 is comprised of a second semiconductor layer that can include, for example, Si, SiGe or combinations thereof. The low-temperature epitaxial process forms a base 100 that comprises an intrinsic portion 100a that is typically monocrystalline, and an extrinsic portion 100b that is typically polycrystalline. The area in which the material of base 100 changes from monocrystalline to polycrystalline is referred to as a facet region.

The base 100 can be doped during the epitaxial growth process or it can be doped after utilizing ion implantation. An annealing step can be used to activate the dopants within the base layer. The base 100 is doped with a second conductivity type dopant that differs in conductivity type from that of the SOI layer 18, which is comprised of a first semiconductor material.

The base 100 has a variable thickness in which the extrinsic portion 100b is thickener than the intrinsic portion 100a. On average, the base 100 typically has a thickness from about 10 to about 150 nm.

A second insulator 36 that may comprise the same or different insulator as the first insulator 30 is then formed on top of the base 100. The second insulator 36 is formed by a conventional deposition process such as chemical vapor deposition. The thickness of the second insulator 36 may vary depending on the process used in forming the same. Typically, the second insulator 36 has a thickness from about 50 to about 150 nm.

The second insulator 36 is then patterned by lithography and etching to provide at least one opening that exposes the surface of the underlying intrinsic portion 100a of the base 100.

Next, the emitter 52 comprising a third semiconductor layer, such as Si, SiGe or a combination thereof, is formed on the second insulator 36 as well as the exposed surface of the intrinsic portion 100a of the base 100. In accordance with the present invention, the emitter 52 includes the same conductivity type dopant as the SOI layer 18. The doping of the emitter 52 may occur in-situ or post deposition utilizing an ion implantation process. The emitter 52 formed typically has a thickness from about 50 to about 200 nm.

The emitter 52 and portions of the second insulating layer 36 are then patterned by lithography and etched providing the structure shown in FIGS. 1B and 1C. After patterning, the exposed surfaces containing Si, i.e., extrinsic base portion 100b, conductive back electrode 24 and emitter 52, are then subjected to a conventional silicidation process in which a silicide metal such as Ti, Ni, Co, W, Re or Pt (singularly or alloys thereof) is first deposited and then annealed to cause interaction of the metal and Si and subsequent formation of a silicide on each region including metal and Si. Alloys of the above mentioned metals are also contemplated herein. Any remaining metal, not silicided, is typically removed after the silicide process using a conventional wet etching process. It is noted that the silicides formed in the extrinsic portion 100b of the 100 are self-aligned to the base emitter 52. The silicidation process is not shown in the drawings the present invention.

At this point of the present invention, an optional barrier material such as a nitride can be formed atop the structure. The optional barrier material is not shown in the drawings of the present invention.

An interconnect dielectric such as, for example, boron phosphorus doped silicate glass, an oxide, an organic polymer or an inorganic polymer is then deposited using a conventional deposited process such as chemical vapor deposition, plasma-assisted chemical vapor deposition, evaporation, spin-on coating, chemical solution deposition and the like. The interconnect dielectric has a thickness after deposition that is on the order of about 500 to about 1000 nm. After deposition of the interconnect dielectric, the interconnect dielectric is planarized by chemical mechanical polishing or other like planarization process so as to have a thickness after planarization from about 300 to about 600 nm and thereafter a contact opening that extends to the surface of each silicide is formed by lithography and etching. Each of the contact openings is then filled with a metal contact such as W, Cu, Al, Pt, Au, Rh, Ru and alloys thereof. The formation of the interconnect structure is not shown in the drawings.

The structure can now be biased by applying an external voltage to the conductive back electrode 24 through the contacts produced above. The biasing causes an accumulation layer 62 to be formed in a portion of the base SOI layer 18 that is located above the thin BOX 22u. The amount of voltage applied in forming the accumulation layer 62 is typically 5 V or less. The accumulation layer 62 serves as the subcollector of the inventive structure.

The method described above can be used to form a plurality of vertical bipolar transistors on the active area of the SOI substrate. The methods described above can also be used in conjunction with a conventional CMOS process flow which is capable of forming CMOS devices such as field effect transistors, in areas adjacent to the areas containing the vertical bipolar transistors of the present invention, to form BiCMOS for RF or mixed-signal applications. In the prior art, the CMOS devices are typically formed prior to the bipolar devices with CMOS areas usually protected during fabrication of the bipolar transistors. The drawback of this method is that the MOS device performance often becomes degraded to the excessive thermal budget that CMOS devices experience during the fabrication of the dipolar devices, such as dopant activation anneal after implants. An advantage of this invention over prior art processes is that the inventive method utilizes the typical CMOS process to form a bipolar device hence the CMOS and bipolar devices can be fabricated interactively and share the same activation anneal.

It is noted that the processing steps described above in forming the substrate shown in FIGS. 2A-2E and FIG. 4 can be used in conjunction with conventional back-gate processes to form a back-gated CMOS device. The CMOS device can be provided separately from the SOI BJT device depicted in FIG. 1A and FIG. 1B, or it can be formed together with the SOI BJT device or any other bipolar transistor in a BiCMOS application.

Figure 5A:
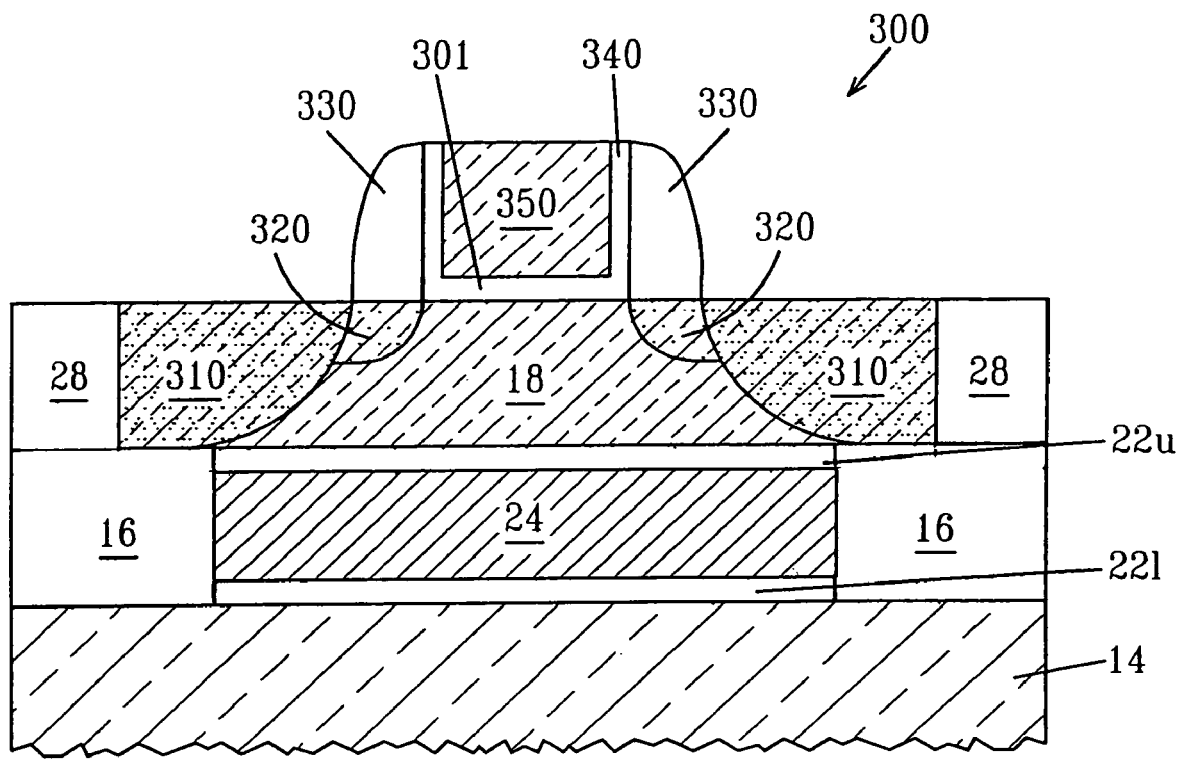
FIGS. 5A and 5B are pictorial representations (through different views) illustrating a back-gated CMOS device of the present invention along two directions that are perpendicular to each other.
Figure 5B:
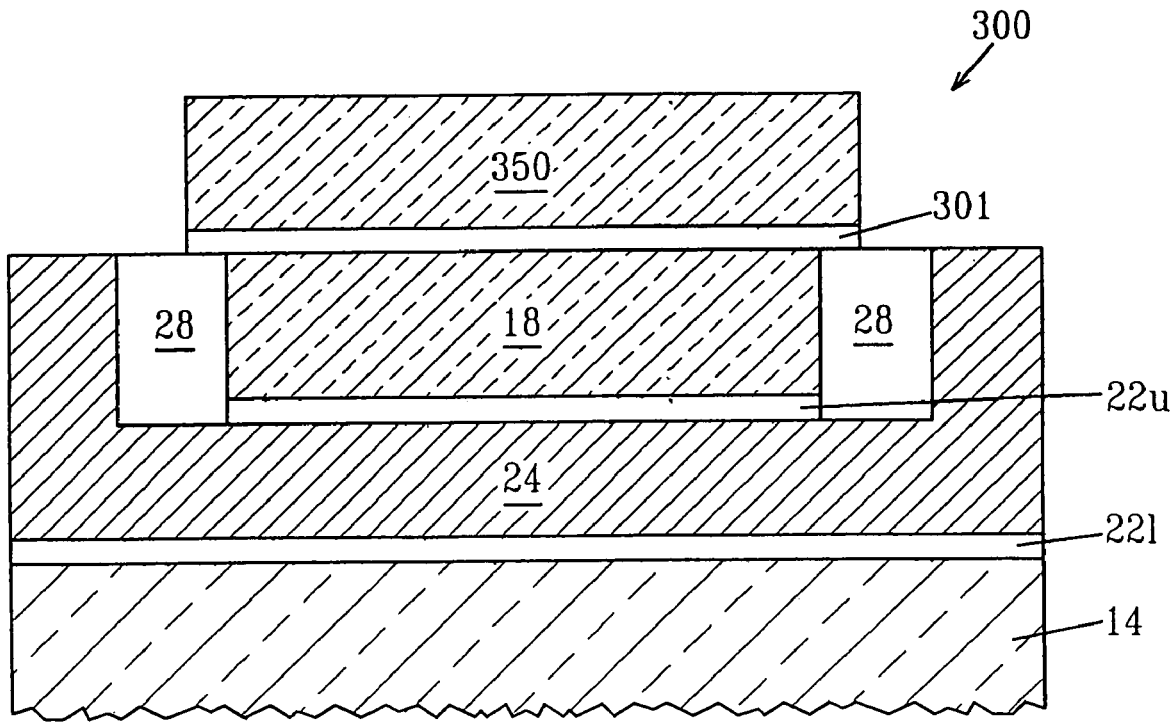

Specifically, FIG. 5A and FIG. 5B shows a back-gated CMOS device that can be formed on the substrate shown in FIG. 2A or FIG. 4. The back-gated device 300 includes Si-containing substrate layer 14, a first buried insulating layer 16 having a first thickness located atop a portion of the Si-containing substrate 14. Other portions of the Si-containing substrate include the lower portion 221 of the second buried insulating layer 22 having a second thickness that is less than the first thickness. A back-gate electrode 24 is located atop the lower portion 221 of the second buried insulating layer 22. An upper portion 22u of the second buried insulating layer 22 is located atop the conductive back electrode 24 and portions of first buried insulating layer 16. SOI layer 18 including source/drain diffusion regions 310 and extension regions 320 is located atop the upper portion 22u of the second buried insulating layer. Trench isolation regions 28 which extend to the first buried insulating layer 16 are located abutting the SOI layer 18. The front-gated device also includes, a gate dielectric 300 located atop a portion of the SOI layer 18 and a gate conductor 350 located atop the gate dielectric 350. An optional, but preferred, reoxidation liner 340 is present on at least the sidewalls of the gate conductor 350. Insulating spacers 330 are located in the structure as well. Gate dielectric 300 and gate conductor 350 are components of a field effect transistor.

The back-gated device 300 is fabricated by first utilizing the methodology used in forming the substrate shown in FIGS. 2E and 4, and then by utilizing conventional CMOS processes steps that are well known in the art. The gate dielectric 300, the gate conductor 350 and the insulating spacers 330 are composed of conventional materials well known to those skilled in the art. For example, the gate dielectric 300 can be an oxide, nitride, oxynitride, a dielectric material having a dielectric constant greater than 4.0, preferably greater than 7.0, or a stack thereof; the gate conductor 350 can be composed of polySi, polySiGe, a metal, a metal silicide, a metal nitride or any combination, including multilayers thereof, and the insulating spacers 330 are composed of an oxide, nitride, oxynitride or combinations, including multilayers thereof.

While the present invention has been particularly shown and described with respect to preferred embodiments, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a bipolar transistor comprising:
providing a silicon-on-insulator (SOI) substrate comprising a first semiconductor layer containing a first conductivity type dopant located over a first buried insulating layer, wherein a portion of the first buried insulating layer beneath said first semiconductor layer is removed by forming a trench into the first semiconductor layer, stopping on said first insulating layer, and performing an isotropic etch process to form an undercut region;
forming a second buried insulating layer on exposed surfaces of said first semiconductor layer, wherein said second buried insulating layer is thinner than said first buried insulating layer and is formed by a thermal growth process;
filling the undercut region and the removed portion of the first semiconductor layer with a conductive back electrode material comprised of doped polysilicon;
forming a base utilizing an epitaxial growth process, said base comprising a second semiconductor layer containing a second conductivity type dopant that is different than the first conductivity type dopant;
forming an emitter comprising a third semiconductor layer including said first conductivity type dopant over a portion of said base; and
biasing the conductive back electrode material to form an accumulation layer at an interface between the first semiconductor layer and the second buried insulating layer.

* * * * *